(12) United States Patent
Qiu

(10) Patent No.: US 12,153,097 B2
(45) Date of Patent: Nov. 26, 2024

(54) POWER FAILURE MONITORING DEVICE AND POWER FAILURE MONITORING METHOD

(71) Applicant: Fulian Precision Electronics (Tianjin) Co., LTD., Tianjin (CN)

(72) Inventor: Duo Qiu, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 18/227,313

(22) Filed: Jul. 28, 2023

(65) Prior Publication Data
US 2023/0366951 A1 Nov. 16, 2023

Related U.S. Application Data

(62) Division of application No. 17/206,761, filed on Mar. 19, 2021, now Pat. No. 11,762,033.

(30) Foreign Application Priority Data

Sep. 16, 2020 (CN) .......................... 202010976408.8

(51) Int. Cl.
| | |
|---|---|
| G01R 31/40 | (2020.01) |
| G06F 1/28 | (2006.01) |
| G06F 1/30 | (2006.01) |
| G06G 7/10 | (2006.01) |
| G06F 1/26 | (2006.01) |
| H02H 1/00 | (2006.01) |
| H02H 7/20 | (2006.01) |

(52) U.S. Cl.
CPC ............. G01R 31/40 (2013.01); G06F 1/28 (2013.01); G06F 1/30 (2013.01); G06G 7/10 (2013.01); *G06F 1/26* (2013.01); *H02H 1/0007* (2013.01); *H02H 7/20* (2013.01)

(58) Field of Classification Search
CPC ... G01R 31/40; G06F 1/28; G06F 1/30; G06F 1/26; G06G 7/10; H02H 1/0007; H02H 7/20
See application file for complete search history.

(56) References Cited

U.S. PATENT DOCUMENTS

| | | | |
|---|---|---|---|
| 11,237,917 B1* | 2/2022 | Sinha | G06F 1/30 |
| 2012/0304011 A1* | 11/2012 | Lai | G06F 11/2294 |
| | | | 714/36 |
| 2019/0033938 A1* | 1/2019 | Ou Yang | G06F 1/32 |
| 2021/0034131 A1* | 2/2021 | Yang | G06F 1/28 |
| 2021/0081286 A1* | 3/2021 | Lambert | G11C 7/1063 |
| 2021/0109582 A1* | 4/2021 | Muccini | G06F 1/3243 |
| 2024/0256024 A1* | 8/2024 | Ning | G06F 1/14 |

* cited by examiner

*Primary Examiner* — Xuxing Chen
(74) *Attorney, Agent, or Firm* — ScienBiziP, P.C.

(57) ABSTRACT

A power failure monitoring device includes an electronic device and a console; the electronic device includes a main board; the console is coupled to the main board and adapted to obtain power failure information in the electronic device, and then analyze a power supply condition of the electronic device according to the obtained power failure information.

6 Claims, 5 Drawing Sheets

007
POWER FAILURE MONITORING DEVICE AND POWER FAILURE MONITORING METHOD

CROSS-REFERENCE TO RELATED APPLICATIONS

This application is a divisional application of U.S. application Ser. No. 17/206,761 filed on Mar. 19, 2021.

FIELD

The subject matter herein generally relates to power supplies, and more particularly to a power failure monitoring device and a power failure monitoring method for monitoring a power failure of a power supply.

BACKGROUND

Power failure monitoring of a server is mainly to transmit detected power failure information to a baseboard management controller through a programmable logic device, and the baseboard management controller displays the power failure information in a log. Generally, the power failures are divided into power-on failures and power-off failures. Power-off failures generally refer to a failure state of a power supply status indication signal that appears after the system has been turned on and started working, and the resulting shutdown is a power-off failure. It can be understood that the failure of the power supply status indication signal means that the power supply status indication signal is set to a low level.

However, in the power failure monitoring of the existing server products, the actual behavior when the power is abnormally powered on cannot be accurately reflected, and there is a problem that the accuracy of the power failure monitoring is insufficient.

BRIEF DESCRIPTION OF THE DRAWINGS

Implementations of the present disclosure will now be described, by way of embodiments, with reference to the attached figures.

DETAILED DESCRIPTION

Figure 1:
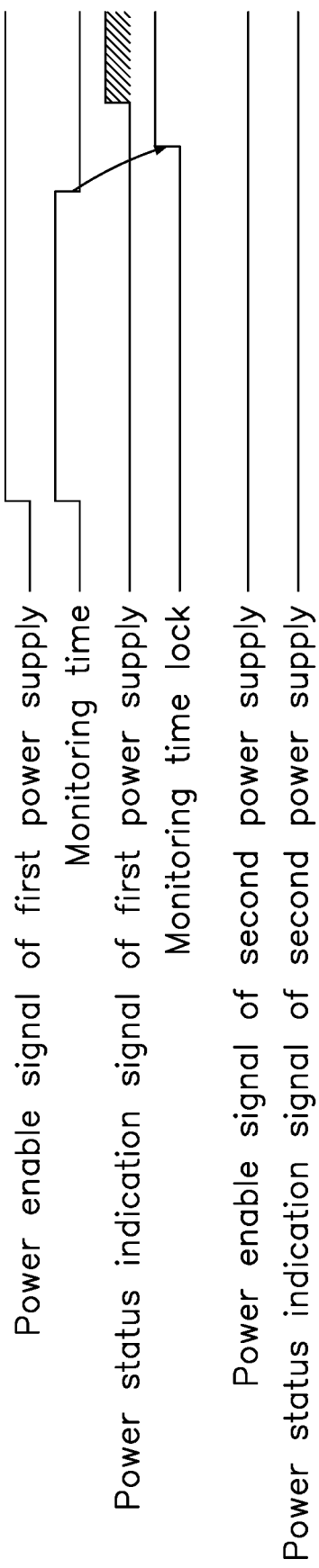
FIG. 1 is a timing diagram of an abnormal power supply.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

In general, the word "module" as used hereinafter refers to logic embodied in hardware or firmware, or to a collection of software instructions, written in a programming language such as, for example, Java, C, or assembly. One or more software instructions in the modules may be embedded in firmware such as in an erasable-programmable read-only memory (EPROM). It will be appreciated that the modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

Referring to FIG. 1, for the detection of a power-on failure, a programmable logic device sends a power supply enable signal to each power supply, and then starts a counter to start counting. If the counter is full, that is, when the current count of the counter reaches a preset value, and the power supply status indication signal of the power supply is still in the invalid state, it is judged as a power-on failure.

Figure 2:
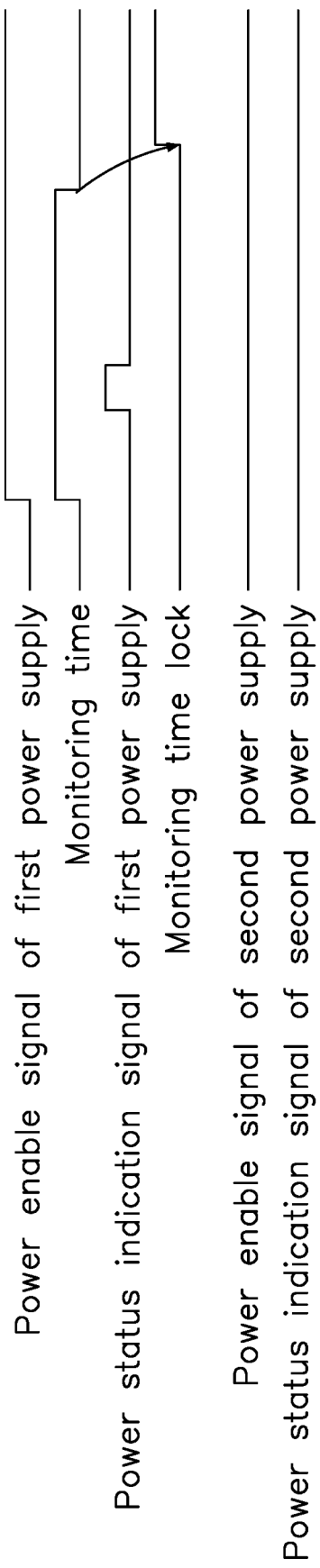
FIG. 2 is a timing diagram of a third type of power failure.

In the logic design for monitoring power-on failures, the counting parameters of the counter are usually selected according to the data manual and empirical values of the power device, and then adjusted according to actual measured values. However, there exists a third type of power failure that may be encountered in actual operation, which is generally ignored, as shown in FIG. 2. After the programmable logic device sends the power supply enable signal, if the power supply powers on and powers off before the current count of the counter reaches the preset value, this situation is temporarily referred to as a power failure before power-on timeout. According to the power failure detection mechanism of most current server platforms, when the power supply is turned on and off before the current count of the counter reaches the preset value, the power supply status indication signal will not be detected as valid, and this situation will result in the power failure simply being determined as a power-on timeout, which cannot truly reflect the actual power failure situation.

Figure 3:
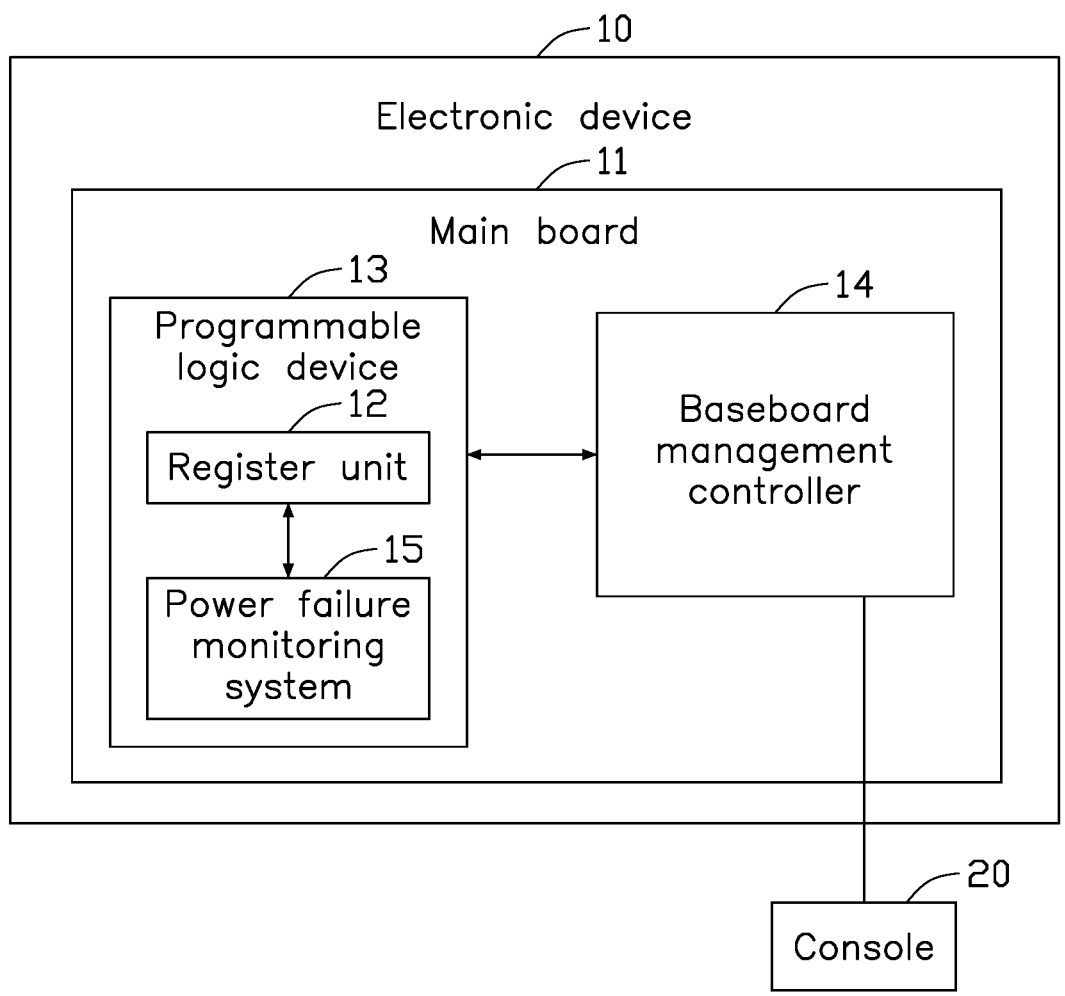
FIG. 3 is a schematic block diagram of a power failure monitoring system provided by an embodiment of the present disclosure.

Referring to FIG. 3, a power failure monitoring device 100 includes an electronic device 10 and a console 20. The console 20 is used to obtain power failure information in the electronic device 10, and then analyze a power supply condition of the electronic device 10 according to the obtained power failure information.

As shown in FIG. 3, the electronic device 10 includes a main board 11. The main board 11 includes a register unit 12, a programmable logic device 13, a baseboard management controller (BMC) 14, and a power failure monitoring system 15. The baseboard management controller is coupled to the programmable logic device 13 through a communication bus, and the power failure monitoring system 15 operates on the programmable logic device 13. The programmable logic device 13 and the baseboard management controller 14 perform bidirectional data transmission. The programmable logic device 13 writes monitored power supply information of the electronic device 10 to the register unit 12. The baseboard management controller 14 accesses the register unit 12 through an I2C communication bus to obtain the power supply information of the electronic device 10.

The power failure monitoring system 15 runs on the programmable logic device 13. The power failure monitoring system 15 can be implemented as a power failure monitoring program. When the power failure monitoring program is executed by the programmable logic device 13, one or more programmable logic devices 13 may implement blocks of a power failure monitoring method executed by the electronic device 10. Alternatively, the programmable logic device 13 implements function modules of the power failure monitoring program.

Those skilled in the art can understand that the schematic diagram is only an example of the electronic device 10 and does not constitute a limitation on the electronic device 10. The electronic device 10 may include more or less components than those shown in the figure, combine certain components, or have different components. For example, the electronic device 10 may also include an input display device (not shown) and a communication module (not shown).

The register unit 12 may store the data monitored by the programmable logic device 13, and the programmable logic device 13 implements various functions of the electronic device 10 by calling the data stored in the register unit 12.

The programmable logic device 13 is generated by a general integrated circuit, and its logic function is determined according to programming of the device. Two main types of programmable logic devices 13 are field programmable gate arrays and complex programmable logic devices. In one embodiment, the programmable logic device 13 is a complex programmable logic device.

The input display device may be a user interaction device, and the input display device provides a user interaction interface. The user interaction interface may be provided for a user to input a command to the electronic device 10, and the electronic device 10 performs corresponding operations after receiving the command.

The electronic device 10 may be a computing device such as a desktop computer, a notebook computer, a tablet computer, a server, and a cloud server.

Figure 4:
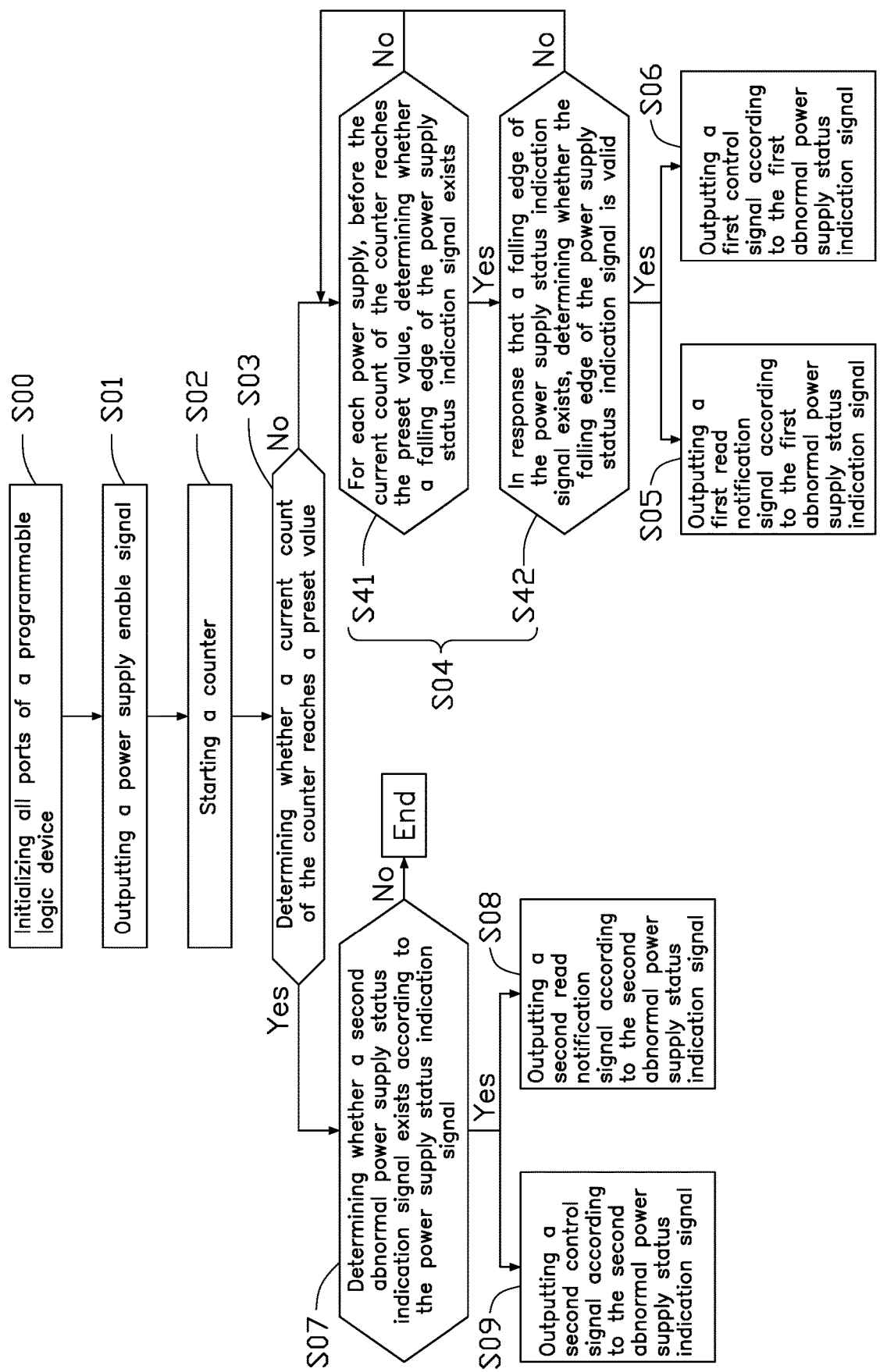
FIG. 4 is a schematic flowchart of a power failure monitoring method provided by an embodiment of the present disclosure.

FIG. 4 is a schematic flowchart of a power failure monitoring method. According to different needs, the order of blocks in the flowchart can be changed, and some blocks can be omitted or combined.

It should be noted that in some application scenarios, such as data centers, which include tens of thousands of servers, all servers can be grouped according to actual application needs, and the power failure monitoring method can be applied to each group separately or to multiple groups at the same time.

At block S00, all ports of the programmable logic device 13 are initialized.

In one embodiment, the baseboard management controller 14 may also be initialized.

At block S01, a power supply enables signal is output. The power supply enable signal is used to instruct a power supply on the main board 11 to be powered on. The power supply may be a single power supply or a group of power supplies.

In one embodiment, the programmable logic device 13 outputs the power supply enable signal to the power supply on the main board 11, so that the power supply is powered on according to the power supply enable signal. After receiving the power supply enable signal, when the power supply is not abnormal, the power supply will be powered on according to the power supply enable signal, and the power supply will output a corresponding power supply status indication signal.

It should be noted that the power supply status indication signal represents whether the power supply is ready. After receiving the power supply enable signal, if the power supply is not abnormal, the power supply will set the power supply status indication signal to a high level and send the power supply status indication signal to the main board 11. The power supply status indication signal set to the high level represents that the power supply is ready. After receiving the power supply enable signal, if the power supply is abnormal, the power supply sets the power supply status indication signal to a low level and sends the power supply status indication signal set to the low level to the motherboard 11. The power supply status indication signal set to the low level indicates that the power supply is not ready.

In one embodiment, the motherboard 11 may be a CPU, memory, or other types of chips. One or more servers can be grouped according to the type of the main board 11, and then the power failure monitoring method for each group of power supplies is executed according to the grouping.

At block S02, a counter is started.

In one embodiment, the counter is started when the programmable logic device 13 outputs the power supply enable signal.

It can be understood that counting is one of the simplest basic operations. The counter is a logic circuit that realizes this operation. In the digital system, the counter mainly counts the number of pulses to realize the functions of measurement, counting, and control, and at the same time, there is a frequency division function. The counter is composed of a basic counting unit and some control gates. The counting unit is composed of a series of various triggers with the function of storing information. These triggers include RS triggers, T triggers, D triggers, and JK flip-flops. A preset value is set for a count of the counter in advance to determine whether a current count of the counter reaches the preset value.

At block S03, whether the current count of the counter reaches the preset value is determined.

In one embodiment, a user can set the preset value of the counter in advance, so that the counter counts the corresponding pulses. In response that the current count of the counter has reached the preset value, block S04 is implemented. In response that the current count of the counter has not reached the preset value, block S07 is implemented.

At block S04, for each power supply, before the current count of the counter reaches the preset value, whether a first abnormal power supply status indication signal exists is determined according to a falling edge of the power supply status indication signal.

Specifically, block S04 includes block S41 and block S42.

At block S41, for each power supply, before the current count of the counter reaches the preset value, whether a falling edge of the power supply status indication signal exists is determined.

In one embodiment, the counter is started, and at the same time, whether there is a falling edge of the power supply status indication signal is determined. In response that there is a falling edge of the power supply status indication signal, block S42 is implemented. In response that there is no falling edge of the power supply status indication signal, it is determined that the first abnormal power supply status indication signal does not exist, and block S41 is continued until the current count of the counter reaches the preset value or the first abnormal power supply status indication signal appears. When the power supply sets the power supply status indication signal to a high level and outputs the power supply status indication signal to the main board 11, the power supply is ready. When the power supply sets the power supply status indication signal to a low level and outputs the power supply status indication signal to the main board 11, the power supply is not ready. After the power supply sets the power supply status indication signal to a high level, and then sets the power supply status indication signal to a high level again due to a certain failure, a falling edge of the power supply status indication signal exists, which represents that the power supply has turned off and back on, and the first abnormal power supply status indication signal exists.

At block S42, in response that a falling edge of the power supply status indication signal exists, whether the falling edge of the power supply status indication signal is valid is determined.

In one embodiment, in order to avoid errors, it is necessary to determine whether the falling edge of the power supply status indication signal is valid. If the falling edge of the power supply status indication signal is valid, it is determined that the first abnormal power supply status indication signal exists. If the falling edge of the power supply status indication signal is invalid, it is determined that the first abnormal power supply status indication signal does not exist, and block S41 is continued until the current count of the counter reaches the preset value or it is determined that the first abnormal power supply status indication signal appears.

In one embodiment, before the counter reaches the preset value, if the first abnormal power supply status indication signal does not exist, the falling edge of the power supply status indication signal is continued to be used to determine whether the first abnormal power supply status indication signal exists until the current count of the counter reaches the preset value or it is determined that the first abnormal power supply status indication signal exists.

At block S05, in response that the first abnormal power supply status indication signal exists, a first read notification signal according to the first abnormal power supply status indication signal is output, so that the baseboard management controller 14 reads the first abnormal power supply status indication signal according to the first read notification signal, and a corresponding power supply status log is generated.

In one embodiment, in response that it is determined that the first abnormal power supply status indication signal exists, the programmable logic device 13 generates the corresponding power supply status log and uploads the corresponding power supply status log to the console 20 to notify the baseboard management controller 14 to read the first abnormal power supply status indication signal.

At block S06, in response that the first abnormal power supply status indication signal exists, a first control signal according to the first abnormal power supply status indication signal is output. The first control signal is used to control the power supply corresponding to the first abnormal power supply status indication signal to power off.

In one embodiment, in response that it is determined that the first abnormal power supply status indication signal exists, the programmable logic device 13 outputs the first control signal so that the power supply corresponding to the first abnormal power supply status indication signal is powered off according to the first control signal.

In one embodiment, in response that it is determined that the first abnormal power supply status indication signal exists, the power-on abnormality of the power supply or the group of power supplies corresponding to the first abnormal power supply status indication signal is stopped being monitored.

In some embodiments, a sequence of blocks S05 and S06 may be different, blocks S05 and S06 may be combined, and one of blocks S05 and S06 may be omitted.

After it is determined that the current count of the counter reaches the preset value, block S07 is implemented.

At block S07, whether a second abnormal power supply status indication signal exists according to the power supply status indication signal is determined.

Specifically, for each power supply, after the current count of the counter reaches the preset value, whether the power supply status indication signal is valid is determined.

In one embodiment, after the current count of the counter reaches the preset value, it is necessary to determine whether the power supply status indication signal of each power supply is valid, that is, it is determined whether the power supply status indication signal is at a high level. In response that the power supply status indication signal is valid, it is determined that the second abnormal power supply status indication signal does not exist, the monitoring of the abnormal power-on of the power supply is ended, and the monitoring of the abnormal power-on of a next power supply is started. In response that the power supply status indication signal is invalid, it is determined that the second abnormal power supply status indication signal exists.

At block S08, in response that the second abnormal power supply status indication signal exists, a second read notification signal according to the second abnormal power supply status indication signal is output, so that the baseboard management controller 14 reads the second abnormal power supply status indication signal according to the second read notification signal, and a corresponding power supply status log is generated.

At block S09, in response that the second abnormal power supply status indication signal exists, a second control signal according to the second abnormal power supply status indication signal is output. The second control signal is used to control the power supply corresponding to the second abnormal power supply status indication signal to power off.

In some embodiments, a sequence of blocks S08 and S09 may be different, blocks S08 and S09 may be combined, and one of blocks S08 and S09 may be omitted.

The power failure monitoring method is suitable for optimizing the monitoring of power supply abnormalities of electronic devices, such as servers.

Figure 5:
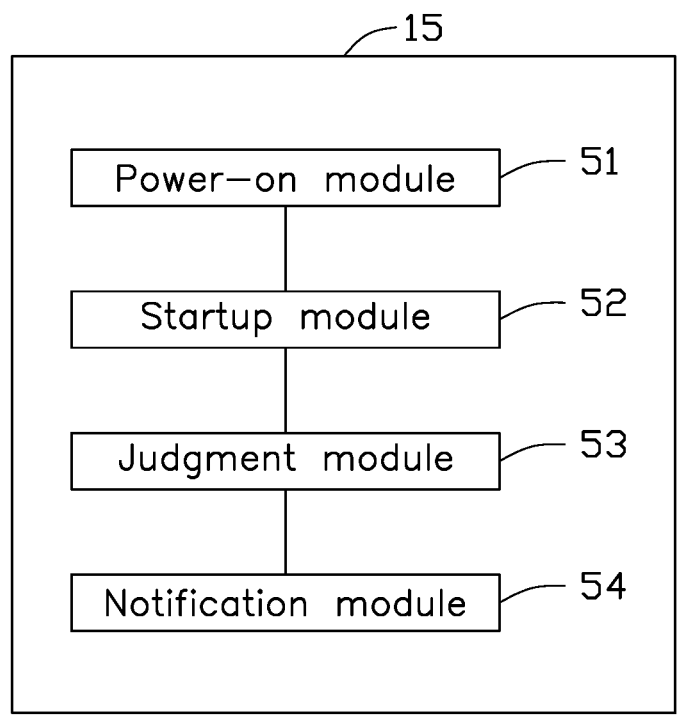
FIG. 5 is a schematic block diagram of a power failure monitoring device provided by an embodiment of the present disclosure.

FIG. 5 is a block diagram of a Power failure monitoring system 15 applied to the programmable logic device 13 on the main board 11. The Power failure monitoring system 15 includes a power-on module 51, a startup module 52, a judgment module 53, and a notification module 54.

The power-on module 51 outputs a power supply enable signal. The power supply enable signal is used to instruct a group of power supplies on the main board 11 to power on.

The startup module 52 includes a start counter.

The judgment module 53 determines for each power supply, before the current count of the counter reaches a preset value, whether a first abnormal power supply status indication signal exists.

The notification module 54 outputs a first read notification signal according to the first abnormal power supply status indication signal in response to the first abnormal power supply status indication signal existing, so that the baseboard management controller 14 reads the first abnormal power supply status indication signal according to the first read notification signal, and a corresponding power supply status log is generated.

In one embodiment, before the current count of the counter reaches the preset value, whether a first abnormal power supply status indication signal exists is determined according to a falling edge of the power supply status indication signal, so as to accurately detect that the power went through a situation where it turned on and off after the programmable logic device 13 sends the power supply enable signal and before the counter reaches the preset value. Thus, operation and maintenance personnel can greatly save troubleshooting time according to the precise type of log in the log record, quickly locate the fault location, and shorten the design and maintenance cycle. Furthermore, the existing programmable logic devices can be used without the need for additional resources.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A power failure monitoring device comprising:
an electronic device; and
a console, wherein
the electronic device comprises a main board, the main board comprises a programmable logic device and a baseboard management controller coupled to the programmable logic device, and
the console is coupled to the main board and adapted to obtain power failure information in the electronic device, and the console analyzes a power supply condition of the electronic device according to the obtained power failure information;
the programmable logic device is configured to:
output a power supply enable signal, the power supply enable signal is used to instruct at least one power supply on the mainboard to power on,
start counting on a counter,
use, before a current reading of the counter reaches a preset value, a falling edge of a power supply status indication signal, for each power supply, to determine whether a first abnormal power supply status indication signal exists,
output a first read notification signal according to the first abnormal power supply status indication signal when the first abnormal power supply status indication signal exists, and
the baseboard management controller reads the first abnormal power supply status indication signal according to the first read notification signal, and generates a corresponding power supply status log;

determine, after the current reading of the counter reaches the preset value, whether a second abnormal power supply status indication signal exists according to the power supply status indication signal, and
output, in response that the second abnormal power supply status indication signal exists, a second read notification signal according to the second abnormal power supply status indication signal, and the baseboard management controller reads the second abnormal power supply status indication signal according to the second read notification signal and generates a corresponding power supply status log.

2. The power failure monitoring device of claim 1, wherein use, before a current reading of the counter reaches a preset value, a falling edge of a power supply status indication signal, for each power supply, to determine whether a first abnormal power supply status indication signal exists, the programmable logic device is further configured to:
determine, before the current reading of the counter reaches the preset value, whether a falling edge of the power supply status indication signal exists for each power supply,
determine, in response that no falling edge of the power supply status indication signal exists, that the first abnormal power supply status indication signal does not exist,
determine, in response that a falling edge of the power supply status indication signal exists, whether the falling edge of the power supply status indication signal is valid,
determine, in response that the power supply status indication signal is valid, that the first abnormal power supply status indication signal exists, and
determine, in response that the falling edge of the power supply status indication signal is invalid, that the first abnormal power supply status indication signal does not exist.

3. The power failure monitoring device of claim 2, wherein the programmable logic device is further configured to:
continue use, in response that the first abnormal power supply status indication signal does not exist, the falling edge of the power supply status indication signal to determine whether the first abnormal power supply status indication signal exists, until the current reading of the counter reaches the preset value or it is determined that the first abnormal power supply status indication signal exists.

4. The power failure monitoring device of claim 3, wherein the programmable logic device is further configured to:
output, in response that the first abnormal power supply status indication signal exists, a first control signal according to the first abnormal power supply status indication signal, and
the first control signal is used to control the power supply, corresponding to the first abnormal power supply status indication signal, to power off.

5. The power failure monitoring device of claim 4, wherein determine, after the current reading of the counter reaches the preset value, whether a second abnormal power supply status indication signal exists according to the power supply status indication signal, the programmable logic device is further configured to:

determine, after the current reading of the counter reaches the preset value, whether the power supply status indication signal is valid for each power supply, end, in response that the power supply status indication signal is valid, a monitoring of an abnormal power-on of the power supply, and determine, in response that the power supply status indication signal is invalid, that the second abnormal power supply status indication signal exists.

6. The power failure monitoring device of claim 5, wherein the programmable logic device is further configured to:

output, in response that the second abnormal power supply status indication signal exists, a second control signal according to the second abnormal power supply status indication signal, and the second control signal is used to control the power supply, corresponding to the second abnormal power supply status indication signal, to power off.

* * * * *